(12) United States Patent
Chang et al.

(10) Patent No.: US 10,531,596 B1
(45) Date of Patent: Jan. 7, 2020

(54) ASSEMBLABLE COOLING FIN ASSEMBLY AND ASSEMBLY METHOD THEREOF

(71) Applicant: Cooler Master Co., Ltd., New Taipei (TW)

(72) Inventors: Ting-Jui Chang, New Taipei (TW); Chang-Han Tsai, New Taipei (TW)

(73) Assignee: COOLER MASTER CO., LTD., New Taipei (TW)

( * ) Notice: Subject to any disclaimer, the term of this patent is extended or adjusted under 35 U.S.C. 154(b) by 0 days.

(21) Appl. No.: 16/145,899

(22) Filed: Sep. 28, 2018

(30) Foreign Application Priority Data

Jun. 26, 2018 (TW) .............................. 107208538 U

(51) Int. Cl.
*H05K 7/20* (2006.01)
*F28F 3/02* (2006.01)

(52) U.S. Cl.
CPC ......... *H05K 7/20418* (2013.01); *F28F 3/027* (2013.01)

(58) Field of Classification Search
USPC ............................................ 165/78; 361/709
See application file for complete search history.

(56) References Cited

U.S. PATENT DOCUMENTS

| | | | | |
|---|---|---|---|---|
| 6,607,023 B2 * | 8/2003 | Ho | ...................... | H01L 23/3672 165/185 |
| 6,607,028 B1 * | 8/2003 | Wang | ...................... | F28F 3/02 165/185 |
| 6,754,079 B1 * | 6/2004 | Chang | .................. | H01L 23/3672 165/185 |
| 6,765,799 B1 * | 7/2004 | Huang | ................ | H01L 23/3672 165/185 |
| 6,766,851 B1 * | 7/2004 | Lo | ........................ | H01L 21/4882 165/185 |
| 6,883,591 B2 * | 4/2005 | Lai | ...................... | H01L 23/3672 165/185 |
| 7,025,122 B2 * | 4/2006 | You-Tien | .................. | F28F 1/30 165/185 |
| 7,032,650 B1 * | 4/2006 | Tian | ..................... | H01L 23/3672 165/185 |
| 7,044,197 B2 * | 5/2006 | Lee | ...................... | H01L 23/3672 165/80.3 |
| 8,118,081 B2 * | 2/2012 | Zha | ...................... | H01L 21/4882 165/78 |
| 2004/0040700 A1 * | 3/2004 | Tsai | .......................... | F28F 3/02 165/185 |

(Continued)

*Primary Examiner* — William H. Mayo, III
*Assistant Examiner* — Krystal Robinson
(74) *Attorney, Agent, or Firm* — Tim Tingkang Xia, Esq.; Locke Lord LLP

(57) ABSTRACT

An assemblable cooling fin assembly includes a plurality of cooling fins. Each of the cooling fins includes a base plate, a first side plate, a second side plate and a first engaging protrusion. The base plate has a first engaging slot. The first side plate and the second side plate are respectively connected to two opposite sides of the base plate. The first engaging protrusion has a connecting end and a deformable end opposite to each other. The connecting end is connected to the first side plate. In addition, the first engaging protrusion of one of the plurality of cooling fins is disposed through the first engaging slot of another one of the plurality of cooling fins, and the deformable end of the first engaging protrusion is deformed so as to become wider than the first engaging slot.

33 Claims, 7 Drawing Sheets

(56) References Cited

U.S. PATENT DOCUMENTS

| | | | |
|---|---|---|---|
| 2006/0285296 A1* | 12/2006 | Chou | H01L 23/3672 361/709 |
| 2007/0215318 A1* | 9/2007 | Chiang | H01L 23/3672 165/78 |
| 2008/0179043 A1* | 7/2008 | Ho | F28F 3/02 165/78 |
| 2009/0183863 A1* | 7/2009 | Shu | F28F 3/06 165/78 |
| 2009/0194253 A1* | 8/2009 | Shen | H01L 23/3672 165/78 |

* cited by examiner

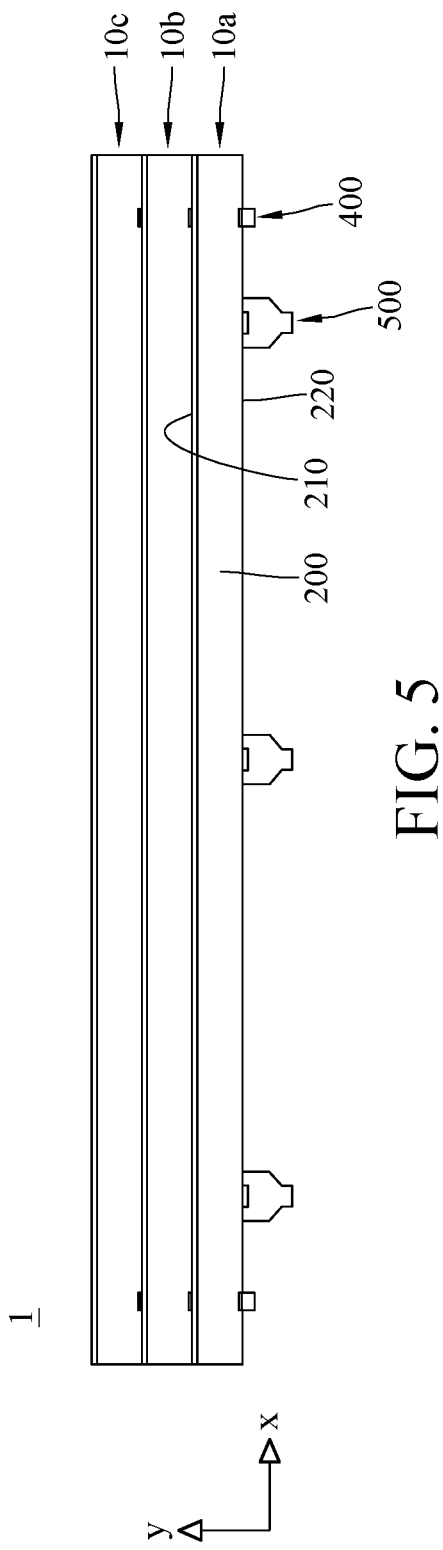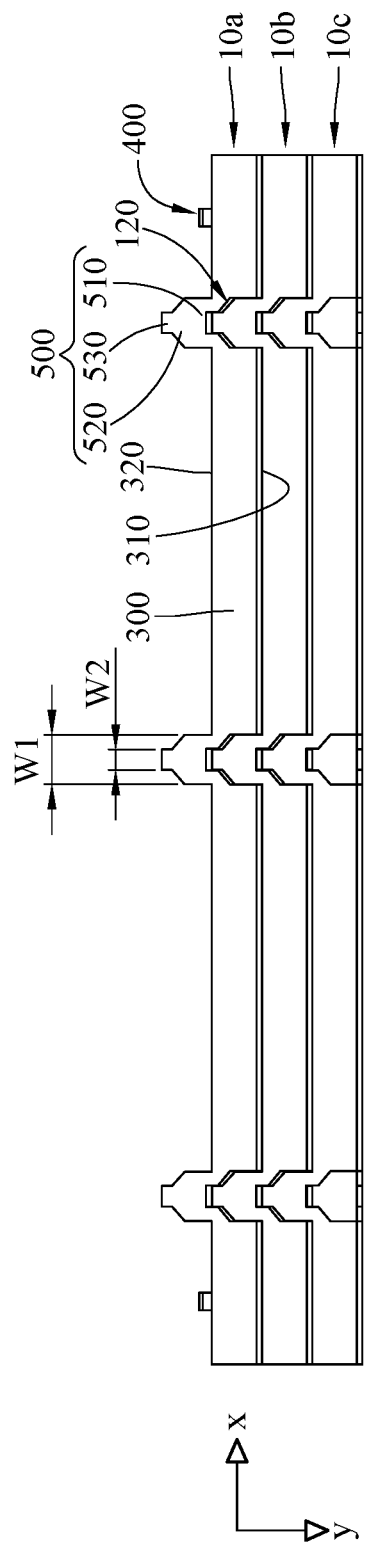

ASSEMBLABLE COOLING FIN ASSEMBLY AND ASSEMBLY METHOD THEREOF

CROSS-REFERENCE TO RELATED APPLICATIONS

This non-provisional application claims priority under 35 U.S.C. § 119(a) on Patent Application No(s). 107208538 filed in Taiwan on Jun. 26, 2018, the entire contents of which are hereby incorporated by reference.

TECHNICAL FIELD

The disclosure relates to an assemblable cooling fin assembly and an assembly method thereof.

BACKGROUND

As the performance of electronic components improves, heat generated per unit volume of the electronic components increased more than ever. Additionally, conventional aluminum extrusion heat sinks and die-cast heat sinks usually have a very limited area for heat dissipation due to how they were formed, and thus they are unable to efficiently dissipate heat even equipped with fans.

Accordingly, manufacturers further modify the conventional heat sinks in order to increase the heat dissipation area. For example, there is an assemblable type heat sink that are consisted of multiple cooling fins and assembling structures, but the assembling structures are complex in configuration, and thus the appearance of the heat sink is not flat.

SUMMARY

The present disclosure provides an assemblable cooling fin assembly and an assembly method thereof in order to simplify the assembling structures of the assembled type heat sink so as to achieve a flat appearance.

One embodiment of the disclosure provides an assemblable cooling fin assembly. The assemblable cooling fin assembly includes a plurality of cooling fins. Each of cooling fins includes a base plate, a first side plate, a second side plate and a first engaging protrusion. The base plate has a first engaging slot. The first side plate and the second side plate are respectively connected to two opposite sides of the base plate. The first engaging protrusion has a connecting end and a deformable end opposite to each other. The connecting end is connected to the first side plate. In addition, the first engaging protrusion of one of the plurality of cooling fins is disposed through the first engaging slot of another one of the plurality of cooling fins, and the deformable end of the first engaging protrusion is deformed so as to become wider than the first engaging slot.

One embodiment of the disclosure provides an assemblable cooling fin assembly. The assemblable cooling fin assembly includes a plurality of cooling fins. Each of cooling fins includes a base plate, a first side plate, a second side plate and a first engaging protrusion. The base plate has a first engaging slot. The first side plate and the second side plate are respectively connected to two opposite sides of the base plate. The first engaging protrusion includes a first inclined portion and a second inclined portion connected to each other. One end of the first inclined portion, which is away from the second inclined portion, is connected to the first side plate. The first engaging protrusion extends toward the second side plate from the first side plate. The first inclined portion extends toward the base plate from the first side plate. The second inclined portion extends away from the base plate. The second inclined portion is disposed through the first engaging slot, and one end of the second inclined portion, which is away from the first inclined portion, presses against one side of the base plate closer to the first side plate and the second side plate.

One embodiment of the disclosure provides an assemblable cooling fin assembly. The assemblable cooling fin assembly includes a plurality of cooling fins. Each of cooling fins includes a base plate, a first side plate, a second side plate, a first engaging protrusion and a second engaging protrusion. The base plate has a first engaging slot and a second engaging slot. The first side plate and the second side plate are respectively connected to two opposite sides of the base plate. The first engaging protrusion and the second engaging protrusion are respectively connected to the first side plate and the second side plate. The first engaging protrusion is engaged in the first engaging slot, and the second engaging protrusion is engaged in the second engaging slot. An extension direction of the first engaging protrusion is different from an extension direction of the second engaging protrusion.

One embodiment of the disclosure provides an assembly method of an assemblable cooling fin assembly. The assembly method includes stacking a cooling fin onto another cooling fin so as to dispose a first engaging protrusion and a second engaging protrusion of the cooling fin respectively through a first engaging slot and a second engaging slot of the another cooling fin, and deforming the first engaging protrusion of the cooling fin so that one end of the first engaging protrusion retains the another cooling fin.

According to the assemblable cooling fin assembly and the assembly method thereof as described above, the assembly process can be achieved by simply disposing the first engaging protrusions through the first engaging slots. Additionally, the first engaging protrusions are also simple in structure, and thus helps to achieve a flat appearance of the first side plates and further a flat appearance of the cooling fins, and reduce the indentations between the first side plates.

BRIEF DESCRIPTION OF THE DRAWINGS

The present disclosure will become more fully understood from the detailed description given hereinbelow and the accompanying drawings which are given by way of illustration only and thus are not intending to limit the present disclosure and wherein:

FIG. 5 is a top view of FIG. 1;

FIG. 6 is a bottom view of FIG. 1; and

DETAILED DESCRIPTION

Figure 1:
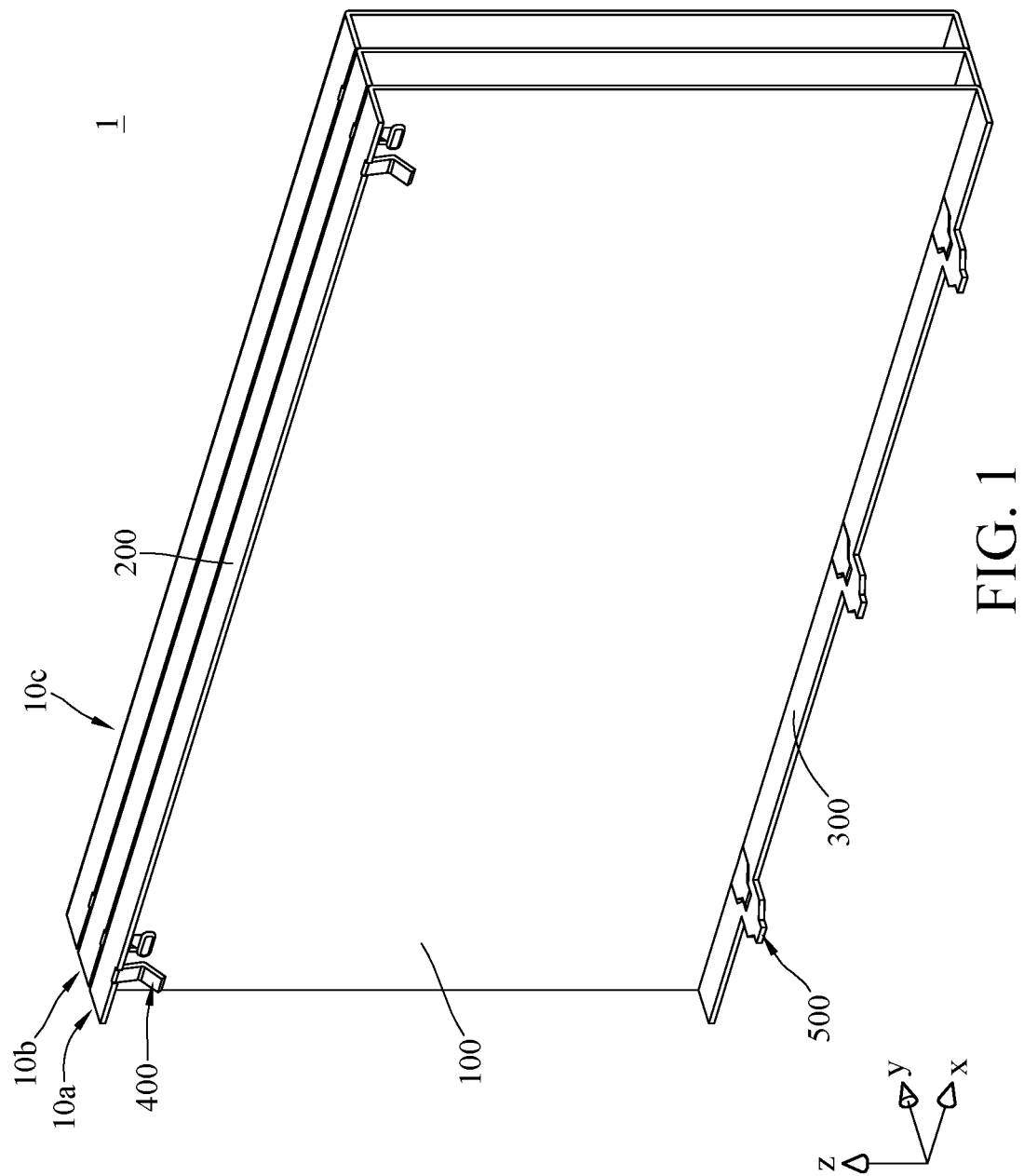
FIG. 1 is a perspective view of an assemblable cooling fin assembly in accordance with a first embodiment of the present disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known accommodation structures and devices are schematically shown in order to simplify the drawing.

Figure 2:
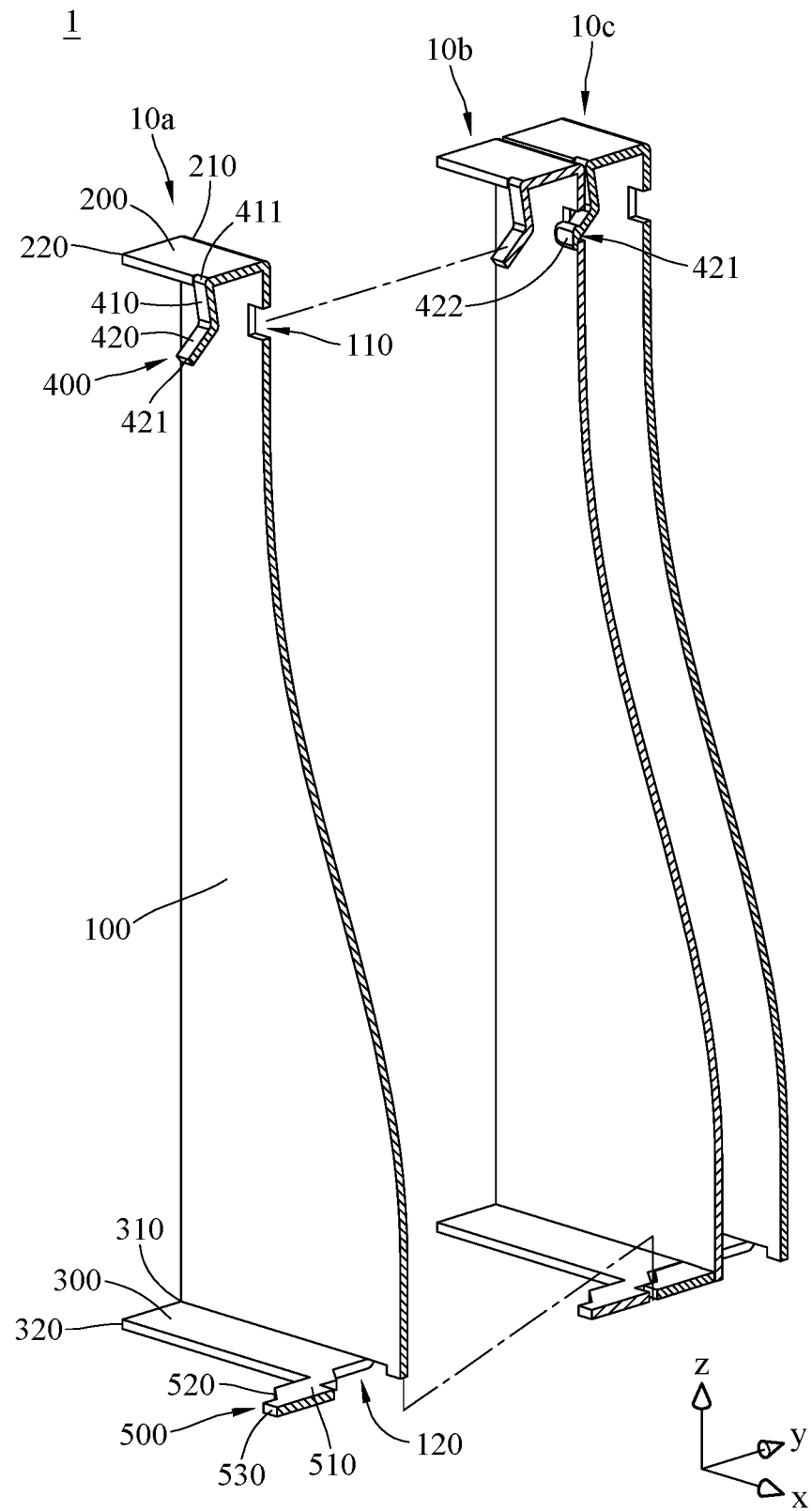
FIG. 2 is a partial enlarged exploded view of FIG. 1.
Figure 3:
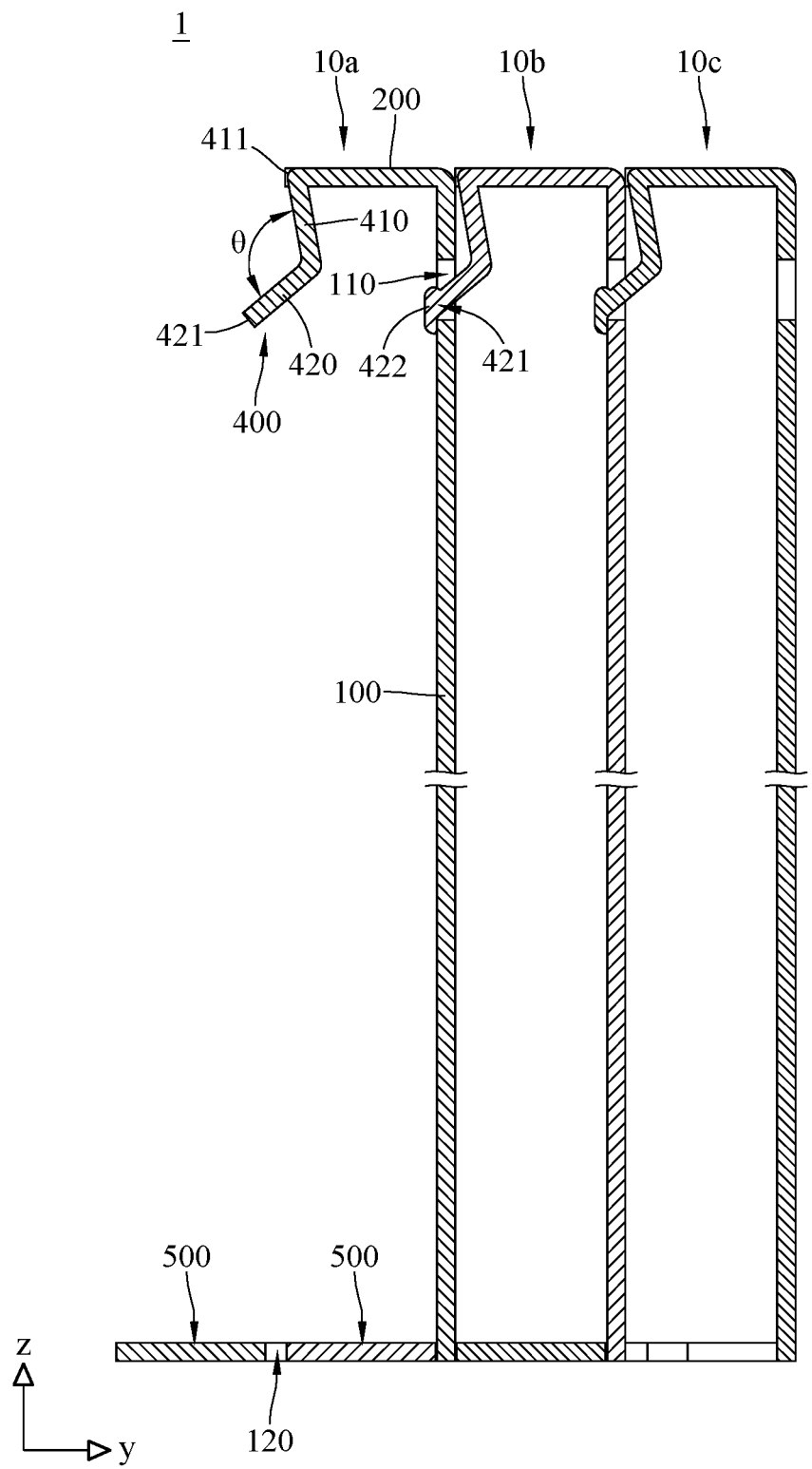
FIG. 3 is a cross-sectional view of FIG. 1.
Figure 4:
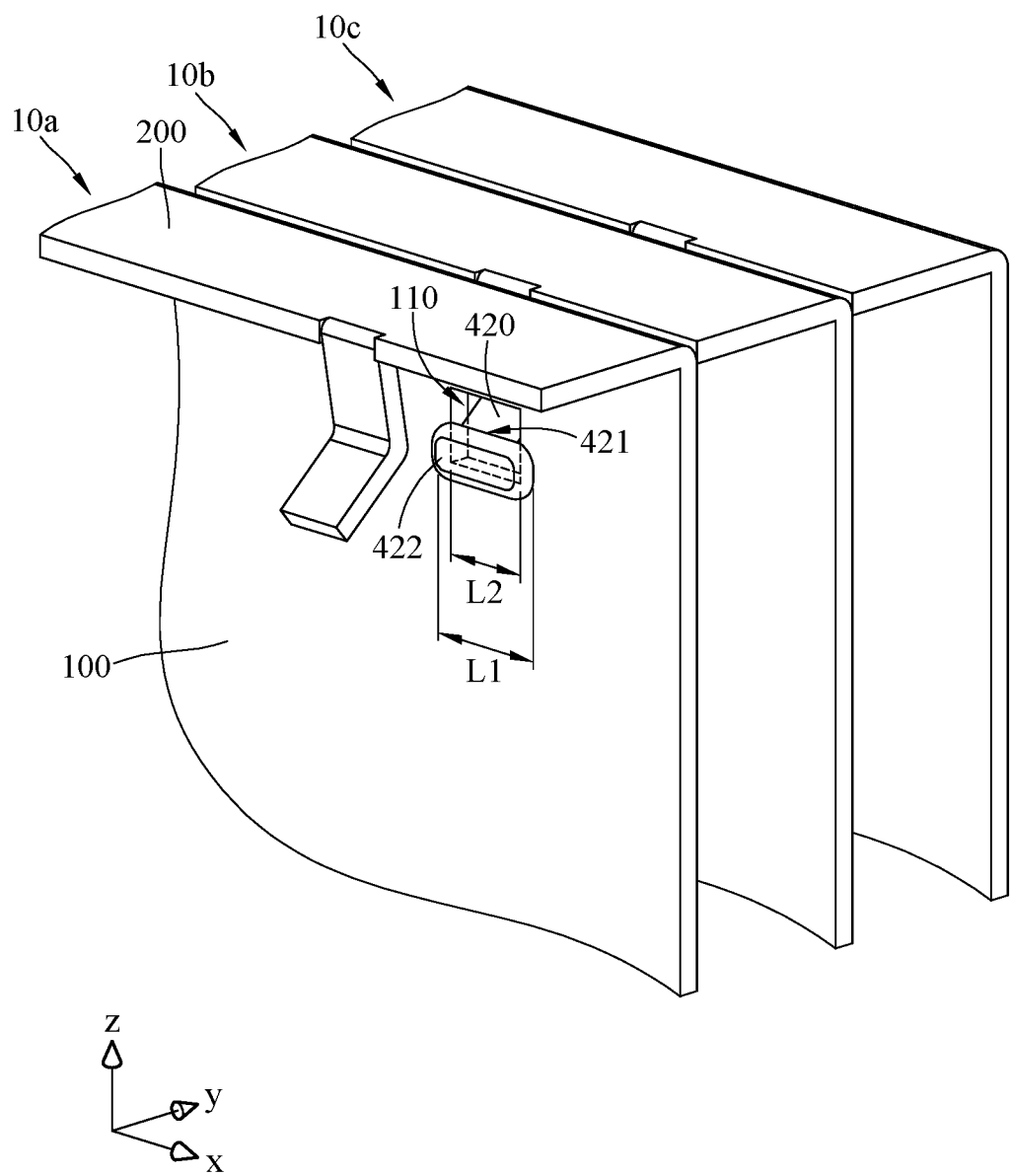
FIG. 4 is a partial enlarged view of FIG. 1.

Please refer to FIG. 1 to FIG. 4. FIG. 1 is a perspective view of an assemblable cooling fin assembly in accordance with a first embodiment of the present disclosure, FIG. 2 is a partial enlarged exploded view of FIG. 1, FIG. 3 is a cross-sectional view of FIG. 1 and FIG. 4 is a partial enlarged view of FIG. 1.

As shown in FIG. 1, this embodiment provides an assemblable cooling fin assembly 1 which includes three cooling fins 10a, 10b and 10c. Each of the cooling fins 10a, 10b and 10c includes a base plate 100, a first side plate 200, a second side plate 300, a first engaging protrusion 400 and a second engaging protrusion 500.

As shown in FIG. 2 to FIG. 4, the first side plate 200 has a first lateral edge 210 and a second lateral edge 220 opposite to each other, and the second side plate 300 has a third lateral edge 310 and a fourth lateral edge 320 opposite to each other. The first lateral edge 210 and the third lateral edge 310 are respectively connected to two opposite sides of the base plate 100. The base plate 100 has a first engaging slot 110 and a second engaging slot 120. The first engaging slot 110 is formed on the base plate 100 by, for example, a stamping manufacturing process. The first engaging slot 110 is separated from edges of the base plate 100; that is, the first engaging slot 110 is not directly connected to the edges of the base plate 100. The second engaging slot 120 is formed on the base plate 100 and the second side plate 300 by, for example, a stamping manufacturing process and is directly connected to an edge of the base plate 100. As shown in FIG. 2, the second engaging slot 120 is on the second side plate 300 and extends from the base plate 100.

The first engaging protrusion 400 includes a first inclined portion 410 and a second inclined portion 420 connected to each other, wherein the first inclined portion 410 is located between and connected to the second inclined portion 420 and the first side plate 200. In more detail, the first inclined portion 410 has a connecting end 411 which is located away from the second inclined portion 420 and is connected to the second lateral edge 220 of the first side plate 200. The second inclined portion 420 has a deformable end 421 which is located away from the first inclined portion 410 but is located closer to the second side plate 300 than the connecting end 411. As shown in FIG. 3, the first engaging protrusion 400 extends toward the second side plate 300 from the first side plate 200, wherein the first inclined portion 410 extends toward the base plate 100 from the connecting end 411, and the second inclined portion 420 extends away from the base plate 100 from the first inclined portion 410 so as to be disposed through the first engaging slot 110.

Then, as shown in FIG. 4, the deformable end 421 can be deformed to form a deformed structure 422 after being deformed by a certain amount of force. And the deformed structure 422 has a width L1 which is larger than a width L2 of the first engaging slot 110, and thus the second inclined portion 420 can be engaged with the first engaging slot 110 via the deformed structure 422. However, the present disclosure is not limited to the structure formed from the deformable end 421 or how the deformable end 421 would be deformed. In other embodiments, the deformable end 421 may be bent to form a bent structure, and the bent structure can be served as a hook that engages with the base plate 100.

In this embodiment, the first engaging protrusion 400 and the first side plate 200 are made of a single piece, and the first engaging protrusion 400 is directly formed on the second lateral edge 220 of the first side plate 200 by, for example, a sheet metal bending process, but the present disclosure is not limited thereto. In other embodiments, the first engaging protrusion may be a metal piece that is attached to the bottom surface of the first side plate by welding.

In this embodiment, the first inclined portion 410 and the second inclined portion 420 together define an obtuse angle θ therebetween, but the present disclosure is not limited thereto. In other embodiments, the first inclined portion and the second inclined portion may be perpendicular to each other.

The second engaging protrusions 500 connected to the second side plate 300 are formed by, for example, a stamping manufacturing process. As shown in the figures, the second engaging protrusions 500 protrude from and are parallel to the second side plate 300. In more detail, each second engaging protrusion 500 includes a wide part 510, a tapered part 520 and a narrow part 530. The tapered part 520 is connected to and located between the wide part 510 and the narrow part 530, and the wide part 510 is directly connected to the fourth lateral edge 320 of the second side plate 300. The wide part 510 is wider than the narrow part 530 (e.g., FIG. 6 shows that a width W1 of the wide part 510 is larger than a wider W2 of the narrow part 530). In this embodiment, the second engaging protrusions 500 of at least one of the cooling fins 10a, 10b and 10c are able to be respectively disposed through the second engaging slots 120 of another one of the cooling fins 10a, 10b and 10c.

Figure 7:
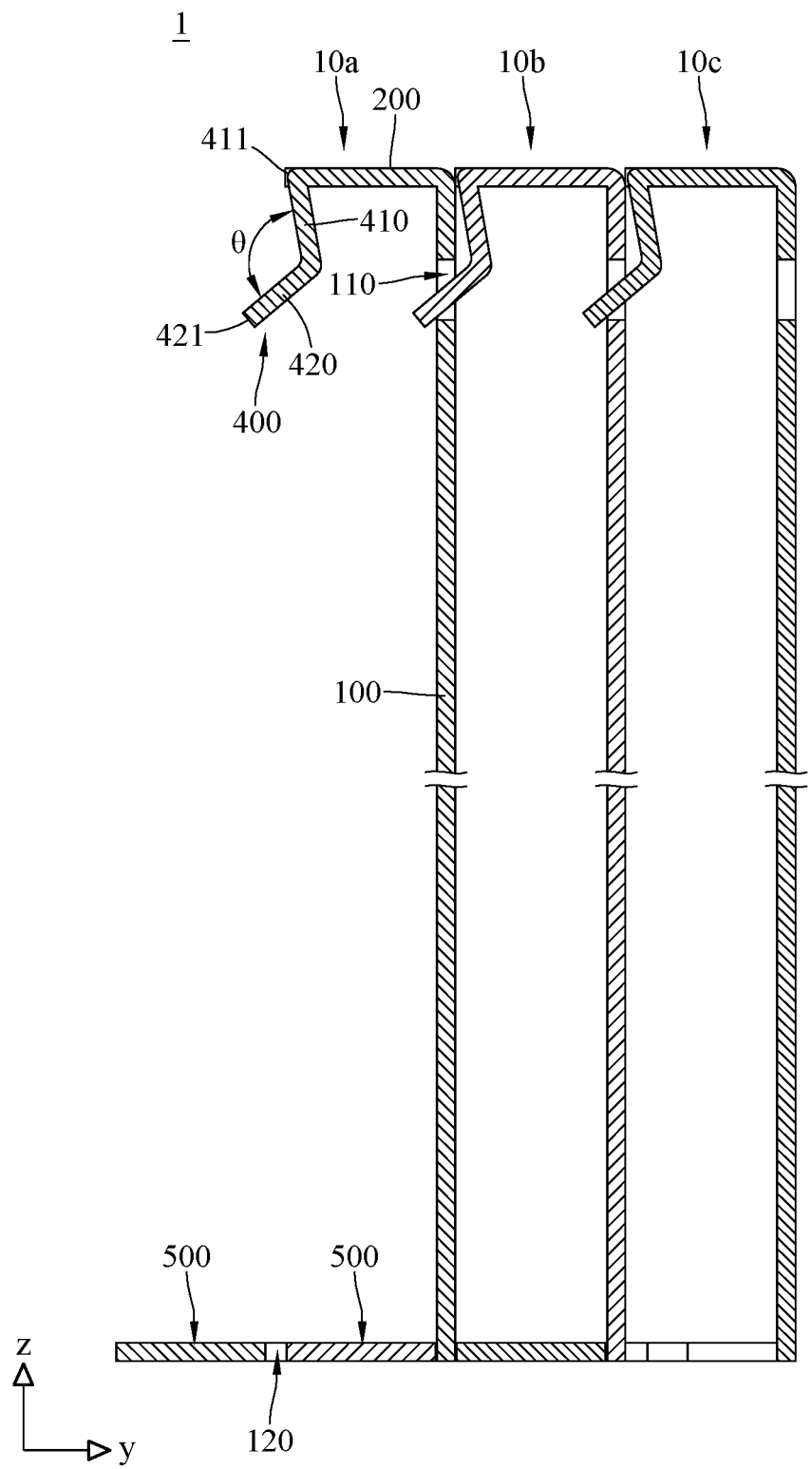
FIG. 7 and FIG. 8 are schematic views of the assembly process of the assemblable cooling fin assembly in FIG. 1.
Figure 8:
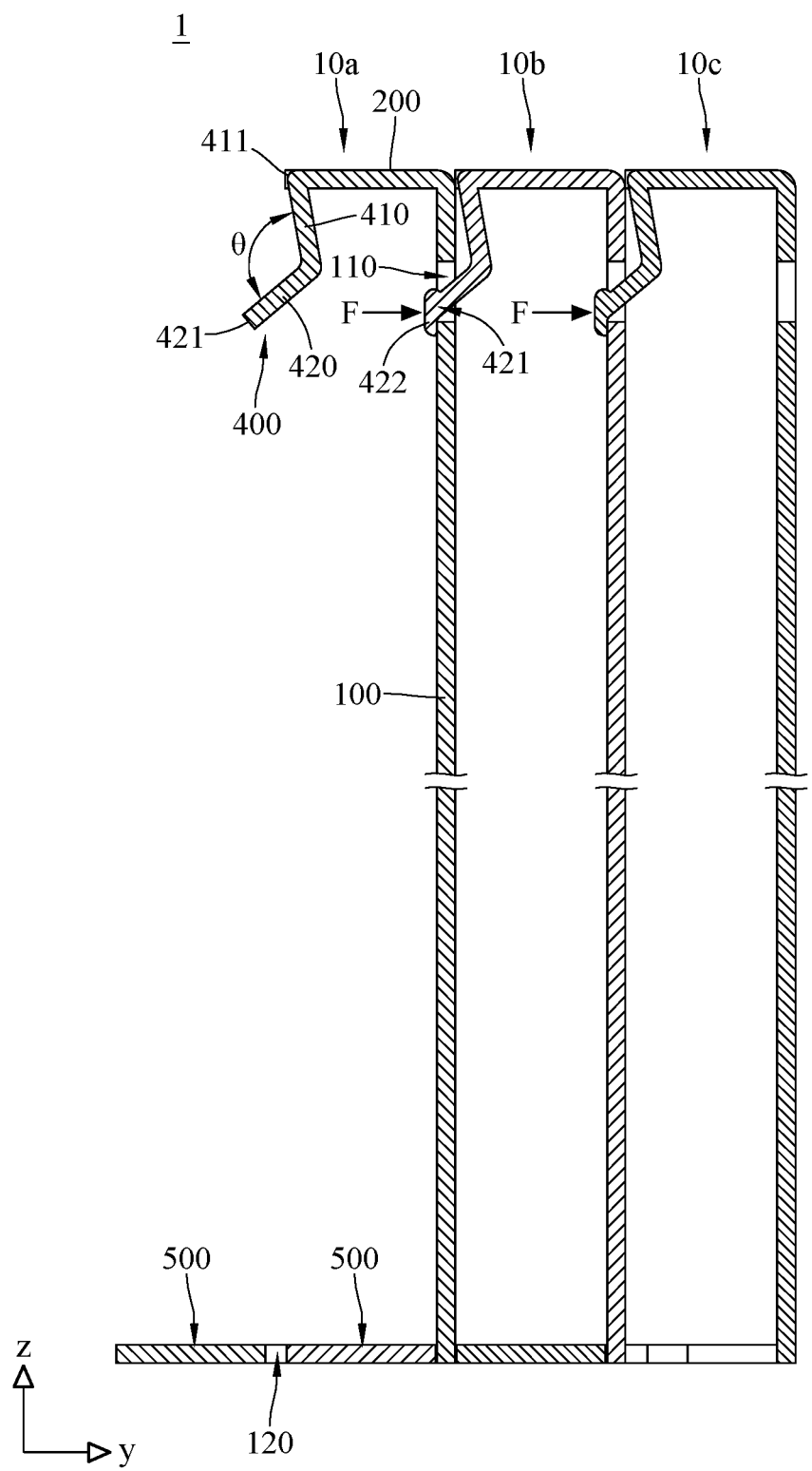

Please refer to FIG. 5 to FIG. 8. FIG. 5 is a top view of FIG. 1, FIG. 6 is a bottom view of FIG. 1, and FIG. 7 and FIG. 8 are schematic views of the assembly process of the assemblable cooling fin assembly in FIG. 1.

As shown in FIG. 7, the cooling fins 10a, 10b, 10c are sequentially stacked so that the second inclined portions 420 of the first engaging protrusions 400 and the second engaging protrusions 500 of the cooling fin 10b are respectively disposed through the first engaging slots 110 and the second engaging slots 120 of the cooling fin 10a, and the second inclined portions 420 of the first engaging protrusions 400 and the second engaging protrusions 500 of the cooling fin 10c are respectively disposed through the first engaging slots 110 and the second engaging slots 120 of the cooling fin 10b.

Then, as shown in FIG. 8, the deformable ends 421 of the second inclined portions 420 of the first engaging protrusions 400 of the cooling fins 10b and 10c are deformed by, for example, a stamping manufacturing process so as to be formed into the deformed structures 422. Consequently, the deformed structures 422 of the cooling fin 10b are able to be engaged with the first engaging slots 110 of the cooling fin 10a, and the deformed structures 422 of the cooling fin 10c are able to be engaged with the first engaging slots 110 of the cooling fin 10b, such that the cooling fin 10a and the cooling fin 10b are assembled to each other, and the cooling fin 10b and the cooling fin 10c are assembled to each other. As a result, the cooling fins 10a, 10b and 10c are assembled into the assembly of the assemblable cooling fin assembly 1.

As shown in FIG. 5 and FIG. 6, the assembly process can be achieved by simply disposing the first engaging protrusions 400 through the first engaging slots 110 and disposing the second engaging protrusions 500 through the second engaging slots 120. Additionally, the first engaging protrusions 400 and second engaging protrusions 500 are also simple in structure, and thus helps to achieve a flat appearance of the first side plates 200 (as seen in FIG. 5) and the second side plates 300 (as seen in FIG. 6) and reduce the indentations between the first side plates 200 and the second side plates 300.

In the above embodiments, the first engaging protrusions 400 are deformed after the cooling fins 10a, 10b and 10c were sequentially stacked on one another, but the present disclosure is not limited thereto. In other embodiments, the first engaging protrusions may be bent to form bent structures that can be engaged with the base plate before stacking these cooling fins; thus, in this case, the first engaging protrusions may have no deformable end 421 as discussed above.

Furthermore, in this embodiment, the first engaging protrusions 400 and the second engaging protrusions 500 extend in different directions, which helps the cooling fin to be firmly assembled to the adjacent cooling fin, but the present disclosure is not limited thereto. In other embodiments, the second engaging protrusions 500 may be replaced by the first engaging protrusions 400, such that the cooling fin have the first engaging protrusion 400 on both sides.

According to the assemblable cooling fin assembly and the assembly method thereof as described above, the assembly process can be achieved by simply disposing the first engaging protrusions through the first engaging slots and disposing the second engaging protrusions through the second engaging slots. Additionally, the first engaging protrusions and second engaging protrusions are also simple in structure, and thus helps to achieve a flat appearance of the first side plates and the second side plates and reduce the indentations between the first side plates and the second side plates.

The embodiments were chosen and described in order to best explain the principles of the disclosure and its practical applications, to thereby enable others skilled in the art to best utilize the disclosure and various embodiments with various modifications as are suited to the particular use contemplated. It is intended that the scope of the disclosure be defined by the following claims and their equivalents.

What is claimed is:

1. An assemblable cooling fin assembly, comprising:
   a plurality of cooling fins, each of the plurality of cooling fins comprising:
   a base plate, having a first engaging slot;
   a first side plate and a second side plate, respectively connected to two opposite sides of the base plate; and
   a first engaging protrusion, extending toward the second side plate from the first side plate and having a connecting end and a deformable end opposite to each other, wherein the connecting end is connected to the first side plate, wherein the first engaging protrusion comprises a first inclined portion and a second inclined portion connected to each other, the first inclined portion is connected to the first side plate via the connecting end and extends toward the base plate, and the second inclined portion is connected to one end of the first inclined portion, which is away from the connecting end, and extends away from the base plate, and the deformable end is located at one side of the second inclined portion which is away from the first inclined portion;
   wherein the first engaging protrusion of one of the plurality of cooling fins is disposed through the first engaging slot of another one of the plurality of cooling fins, and the deformable end of the first engaging protrusion is deformed so as to become wider than the first engaging slot.

2. The assemblable cooling fin assembly according to claim 1, wherein the connecting end is connected to one side of the first side plate away from the base plate.

3. The assemblable cooling fin assembly according to claim 1, wherein the first inclined portion and the second inclined portion define an obtuse angle therebetween.

4. The assemblable cooling fin assembly according to claim 1, wherein the deformable end has a deformed structure.

5. The assemblable cooling fin assembly according to claim 1, wherein the deformable end has a bent structure.

6. The assemblable cooling fin assembly according to claim 1, wherein the first engaging protrusion is formed on the first side plate by a sheet metal bending process.

7. The assemblable cooling fin assembly according to claim 1, wherein each of the plurality of cooling fins has a second engaging slot, the second engaging slot is formed on the base plate and the second side plate, each of the plurality of cooling fins further comprises a second engaging protrusion, the second engaging protrusion protrudes from one side of the second side plate away from the base plate, and the second engaging protrusion of one of the plurality of cooling fins is disposed through the second engaging slot of another one of the plurality of cooling fins.

8. The assemblable cooling fin assembly according to claim 7, wherein the second engaging protrusions are parallel to the second side plate.

9. The assemblable cooling fin assembly according to claim 7, wherein the second engaging protrusions are formed by a stamping manufacturing process, and the second engaging slots are formed by a stamping manufacturing process.

10. The assemblable cooling fin assembly according to claim 7, wherein the second engaging protrusion comprises a wide part, a narrow part and a tapered part, the wide part is connected to the second side plate, the tapered part is connected to and located between the wide part and the narrow part, and the wide part is wider than the narrow part.

11. An assemblable cooling fin assembly, comprising:
    a plurality of cooling fins, each of the plurality of cooling fins comprising:
    a base plate, having a first engaging slot;
    a first side plate and a second side plate, respectively connected to two opposite sides of the base plate; and
    a first engaging protrusion, comprising a first inclined portion and a second inclined portion connected to each other, wherein one end of the first inclined portion, which is away from the second inclined portion, is connected to the first side plate, the first engaging protrusion extends toward the second side plate from the first side plate, the first inclined portion extends toward the base plate from the first side plate, the second inclined portion extends away from the base plate, the second inclined portion is disposed through the first engaging slot, and one end of the second inclined portion, which is away from the first inclined portion, presses against one side of the base plate closer to the first side plate and the second side plate.

12. The assemblable cooling fin assembly according to claim 11, wherein one end of the first inclined portion, which is away from the second inclined portion, is connected to one side of the first side plate away from the base plate.

13. The assemblable cooling fin assembly according to claim 11, wherein the first inclined portion and the second inclined portion define an obtuse angle therebetween.

14. The assemblable cooling fin assembly according to claim 11, wherein the end of the second inclined portion has a bent structure.

15. The assemblable cooling fin assembly according to claim 11, wherein the first engaging protrusion is formed on the first side plate by a sheet metal bending process.

16. The assemblable cooling fin assembly according to claim 11, wherein each of the cooling fins has a second engaging slot, the second engaging slot is formed on the base plate and the second side plate, each of the plurality of cooling fins further comprises a second engaging protrusion, the second engaging protrusion protrudes from one side of the second side plate away from the base plate, and the second engaging protrusion of one of the plurality of cooling fins is disposed through the second engaging slot of another one of the plurality of cooling fins.

17. The assemblable cooling fin assembly according to claim 16, wherein the second engaging protrusions are parallel to the second side plate.

18. The assemblable cooling fin assembly according to claim 16, wherein the second engaging protrusions are formed by a stamping manufacturing process, and the second engaging slots are formed by a stamping manufacturing process.

19. The assemblable cooling fin assembly according to claim 16, wherein the second engaging protrusion comprises a wide part, a narrow part and a tapered part, the wide part is connected to the second side plate, the tapered part is connected to and located between the wide part and the narrow part, and the wide part is wider than the narrow part.

20. An assemblable cooling fin assembly, comprising:
a plurality of cooling fins, each of the cooling fins comprising:
a base plate, having a first engaging slot and a second engaging slot;
a first side plate and a second side plate, respectively connected to two opposite sides of the base plate; and
a first engaging protrusion and a second engaging protrusion, respectively connected to the first side plate and the second side plate, wherein the first engaging protrusion is engaged in the first engaging slot, and the second engaging protrusion is engaged in the second engaging slot;
wherein an extension direction of the first engaging protrusion is different from an extension direction of the second engaging protrusion.

21. The assemblable cooling fin assembly according to claim 20, wherein the first engaging protrusion extends toward the second side plate from the first side plate.

22. The assemblable cooling fin assembly according to claim 21, wherein the first engaging protrusion has a connecting end and a deformable end opposite to each other, and the first engaging protrusion comprises a first inclined portion and a second inclined portion connected to each other; the first inclined portion is connected to the first side plate via the connecting end and extends toward the base plate, and the second inclined portion is connected to one end of the first inclined portion, which is away from the connecting end, and extends away from the base plate, and the deformable end is located at one side of the second inclined portion which is away from the first inclined portion.

23. The assemblable cooling fin assembly according to claim 22, wherein the connecting end is connected to one side of the first side plate away from the base plate.

24. The assemblable cooling fin assembly according to claim 22, wherein the first inclined portion and the second inclined portion define an obtuse angle therebetween.

25. The assemblable cooling fin assembly according to claim 22, wherein the deformable end has a deformed structure.

26. The assemblable cooling fin assembly according to claim 22, wherein the deformable end has a bent structure.

27. The assemblable cooling fin assembly according to claim 21, wherein the second engaging protrusions are parallel to the second side plate.

28. The assemblable cooling fin assembly according to claim 20, wherein the first engaging protrusion is formed on the first side plate by a sheet metal bending process.

29. The assemblable cooling fin assembly according to claim 20, wherein the second engaging protrusions are formed by a stamping manufacturing process, and the second engaging slots are formed by a stamping manufacturing process.

30. The assemblable cooling fin assembly according to claim 20, wherein the second engaging protrusion comprises a wide part, a narrow part and a tapered part, the wide part is connected to the second side plate, the tapered part is connected to and located between the wide part and the narrow part, and the wide part is wider than the narrow part.

31. An assembly method of an assemblable cooling fin assembly, comprising:
stacking a cooling fin onto another cooling fin so as to dispose a first engaging protrusion and a second engaging protrusion of the cooling fin respectively through a first engaging slot and a second engaging slot of the another cooling fin; and
deforming the first engaging protrusion of the cooling fin so that one end of the first engaging protrusion retains the another cooling fin.

32. The assembly method of claim 31, wherein the first engaging protrusion is formed by a sheet metal bending process or a stamping manufacturing process.

33. An assemblable cooling fin assembly, comprising:
a plurality of cooling fins, each of the plurality of cooling fins comprising:
a base plate, having a first engaging slot;
a first side plate and a second side plate, respectively connected to two opposite sides of the base plate; and
a first engaging protrusion, having a connecting end and a deformable end opposite to each other, wherein the connecting end is connected to the first side plate;
wherein the first engaging protrusion of one of the plurality of cooling fins is disposed through the first engaging slot of another one of the plurality of cooling fins, and the deformable end of the first engaging protrusion is deformed so as to become wider than the first engaging slot so that the deformable end covers two opposite sides of the first engaging slot.

* * * * *